(12) United States Patent
Du et al.

(10) Patent No.: US 8,192,900 B2
(45) Date of Patent: Jun. 5, 2012

(54) ADVANCED PHASE SHIFT LITHOGRAPHY AND ATTENUATED PHASE SHIFT MASK FOR NARROW TRACK WIDTH D WRITE POLE DEFINITION

(75) Inventors: Hong Du, Saratoga, CA (US); Douglas J. Werner, Fremont, CA (US); Yi Zheng, San Ramon, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 52 days.

(21) Appl. No.: 12/714,159

(22) Filed: Feb. 26, 2010

(65) Prior Publication Data

US 2011/0212388 A1 Sep. 1, 2011

(51) Int. Cl.
*G03F 1/00* (2012.01)

(52) U.S. Cl. .......................................... 430/5

(58) Field of Classification Search .............. 430/5, 311, 430/312, 313, 322, 394
See application file for complete search history.

(56) References Cited

U.S. PATENT DOCUMENTS

| | | | | |
|---|---|---|---|---|
| 5,362,591 | A | 11/1994 | Imai et al. | 430/5 |
| 5,414,580 | A | 5/1995 | Levenson et al. | 360/123 |
| 5,512,394 | A * | 4/1996 | Levenson et al. | 430/5 |
| RE35,315 | E | 8/1996 | Okamoto | 430/5 |
| 6,623,895 | B2 | 9/2003 | Chen et al. | 430/5 |
| 6,866,987 | B2 | 3/2005 | Lee | 430/311 |
| 7,014,962 | B2 * | 3/2006 | Lin et al. | 430/5 |
| 7,056,645 | B2 | 6/2006 | Sivakumar et al. | 430/311 |
| 7,425,393 | B2 | 9/2008 | Nakagawa | 430/5 |
| 2007/0279802 | A1 | 12/2007 | Sasaki et al. | 360/126 |

FOREIGN PATENT DOCUMENTS

| | | |
|---|---|---|
| JP | 2002008211 | 1/2002 |
| JP | 2002367119 | 12/2002 |
| JP | 2003177549 | 6/2003 |
| JP | 2004013944 | 1/2004 |
| JP | 2006344260 | 12/2006 |
| JP | 2008305512 | 12/2008 |

OTHER PUBLICATIONS

"Patterning of read head track by alternating phase shifted mask" IBM, Research Disclosure Database No. 457170, May 2002.

(Continued)

*Primary Examiner* — Stephen Rosasco
(74) *Attorney, Agent, or Firm* — Zilka-Kotab, PC

(57) ABSTRACT

A method for patterning a wafer using a phase shifting photolithography that can produce a critical symmetrical 2-dimensional structure such as a magnetic write pole of a magnetic write head. In one aspect of the invention, a photolithographic mask has an opaque portion with narrow, transparent phase shifting regions at either side of the opaque portion. A non-phase shifted region extends beyond the narrow phase shifted portion at either side of the structure. The phase shifted regions are symmetrical about the opaque region so that the image produced on the wafer is completely symmetrical. In another aspect of the invention, a phase shifted region in formed in a transparent medium with non-phase shifted regions at either side of the phase shifted region. The transition between the phase shifted region and non-phase shifted region alone defines a pattern on the wafer, without the need for an opaque structure on the mask.

20 Claims, 31 Drawing Sheets

OTHER PUBLICATIONS

Schurz et al., "Chromium Based Attenuated Embedded Phase Shift Photomask Blanks for Use in 1X Lithography" SPIE vol. 2621, p. 505-515, Dec. 1995.

"MaskTools" ASML, http://www.asml.com/asml/show.do?ctx=10448&ria=684/.

Rhyins et al., "Characterization of Quartz Etched PSM Masks for KrF Lithography at the 100 nm node" Proceedings of SPIE vol. 4562, (Mar. 2002).

* cited by examiner

ADVANCED PHASE SHIFT LITHOGRAPHY AND ATTENUATED PHASE SHIFT MASK FOR NARROW TRACK WIDTH D WRITE POLE DEFINITION

FIELD OF THE INVENTION

The present invention relates to the manufacture of magnetic write heads and more particularly to the application of phase shift mask technology to the fabrication of a write pole having a very narrow track width.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk, and when the disk rotates, air adjacent to the disk moves along with the surface of the disk. The slider flies over the surface of the disk on a cushion of this moving air. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

The write head can include a magnetic write pole and a magnetic return pole, the write pole having a much smaller cross section at the ABS than the return pole. The magnetic write pole and return pole are magnetically connected with one another at a region removed from the ABS. An electrically conductive write coil induces a magnetic flux through the write coil. This results in a magnetic write field being emitted toward the adjacent magnetic medium, the write field being substantially perpendicular to the surface of the medium (although it can be canted somewhat, such as by a trailing shield located near the write pole). The magnetic write field locally magnetizes the medium and then travels through the medium and returns to the write head at the location of the return pole where it is sufficiently spread out and weak that it does not erase previously recorded bits of data.

A magnetoresistive sensor such as a GMR or TMR sensor can be employed for sensing magnetic fields from the rotating magnetic disk. The sensor includes a nonmagnetic conductive layer, or barrier layer, sandwiched between first and second ferromagnetic layers, referred to as a pinned layer and a free layer. First and second leads are connected to the sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos $\Theta$, where $\Theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

In order to increase data density, the size of the read and write head must be constantly reduced. More specifically, one of the parameters that directly affect data density is the track width of the read and write heads. The width of the write pole defines the track width of data recording. Therefore, in order to increase data density the width of the write pole must be reduced. Unfortunately, the amount by which the width of the write pole can be reduced has been limited by current photolithographic and other manufacturing processes. Therefore, there remains a need for a method or process that can allow a write pole to be formed with a very narrow track width in spite of the limitations of photolithography and other manufacturing processes.

SUMMARY OF THE INVENTION

The present invention provides a mask for photolithographic patterning. The mask includes an opaque portion having first and second sides, first and second transparent phase shifting regions formed at the first and second sides of the opaque portion, and a transparent non-phase shifted region extending beyond the first and second phase shifting portions.

In another aspect of the invention, the mask includes a transparent medium, a phase shifted region formed in the transparent medium; and a non-phase shifted region immediately adjacent to the phase shifted region such that a transition between the phase shifted region and non-phase shifted region allows patterning of a feature on the wafer without the need for an opaque feature on the mask.

The mask according to the invention provides a symmetrical pattern on a wafer, while also taking advantage of phase shifting technologies to pattern very small features on a wafer. The use of the novel phase shifting techniques can also allow phase shifting technology to form features that vary in more than one direction on a wafer, such as a write pole having a flared region.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

FIG. 1 is a schematic illustration of a disk drive system in which the invention might be embodied;

FIG. 2 is an ABS view of a slider, taken from line 2-2 of FIG. 1, illustrating the location of a magnetic head thereon;

FIG. 3 is across sectional view of a magnetic head, taken from line 3-3 of FIG. 2 and rotated 90 degrees counterclockwise, of a magnetic head according to an embodiment of the present invention;

DETAILED DESCRIPTION OF THE EMBODIMENTS

The following description is of the best embodiments presently contemplated for carrying out this invention. This description is made for the purpose of illustrating the general principles of this invention and is not meant to limit the inventive concepts claimed herein.

Figure 1:
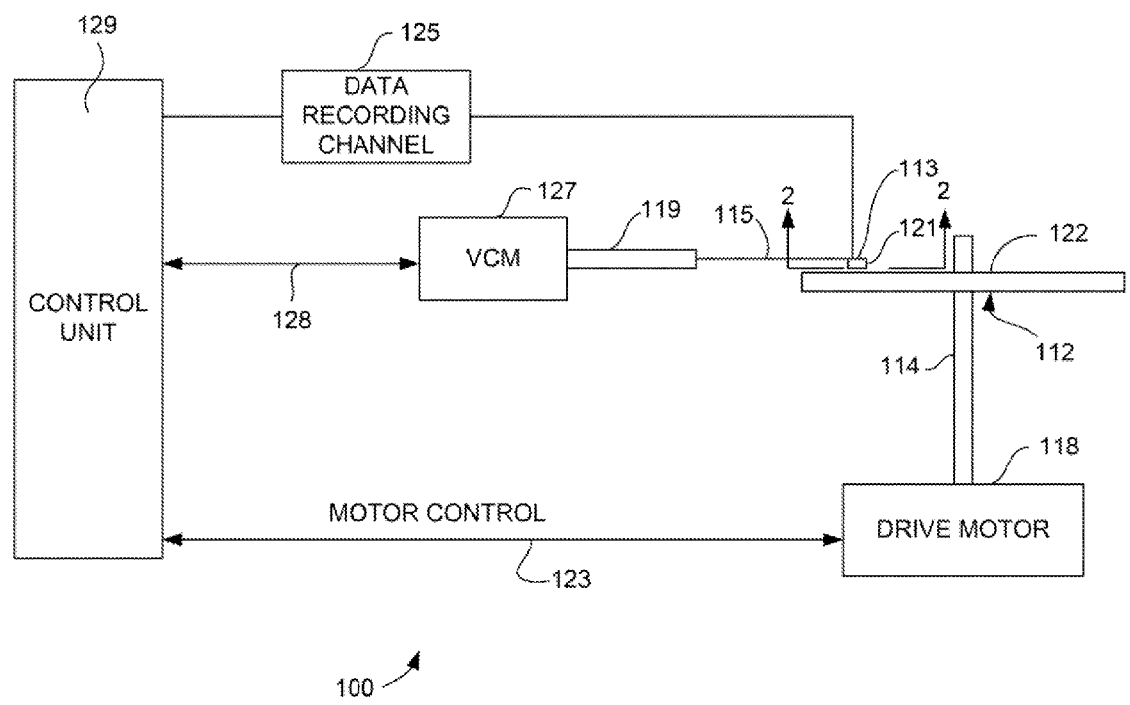

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
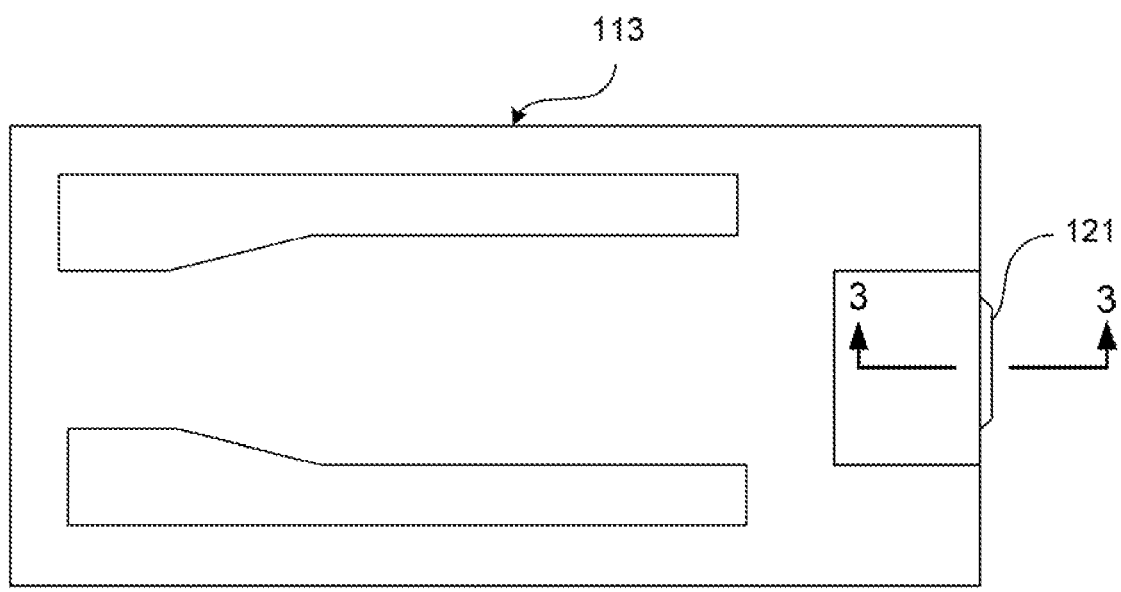

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
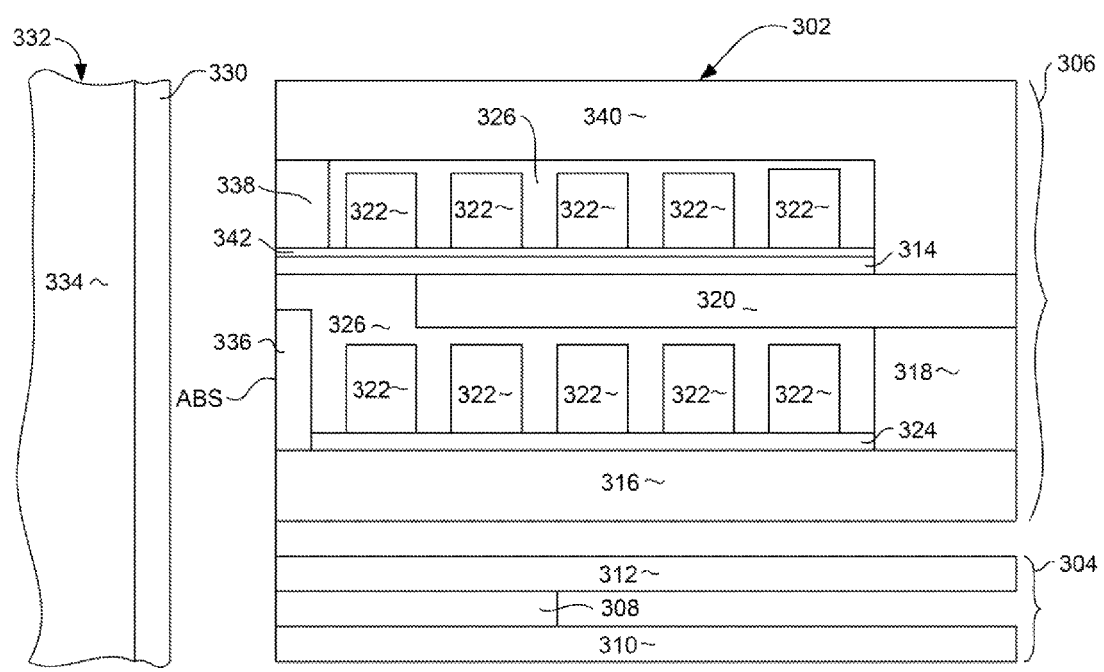

With reference now to FIG. 3, the invention can be embodied in a magnetic head 302. The magnetic head 302 includes a read head 304 and a write head 306. The read head 304 includes a magnetoresistive sensor 308, which can be a GMR, TMR, or some other type of sensor. The magnetoresistive sensor 308 is located between first and second magnetic shields 310, 312.

The write head 306 includes a magnetic write pole 314 and a magnetic return pole 316. The write pole 314 can be formed upon a magnetic shaping layer 320, and a magnetic back gap layer 318 magnetically connects the write pole 314 and shaping layer 320 with the return pole 316 in a region removed from the air bearing surface (ABS). A write coil 322 (shown in cross section in FIG. 3A) passes between the write pole and shaping layer 314, 320 and the return pole 316, and may also pass above the write pole 314 and shaping layer 320. The write coil 322 can be a helical coil or can be one or more pancake coils. The write coil 322 can be formed upon an insulation layer 324 and can be embedded in a coil insulation layer 326 such as alumina and or hard baked photoresist.

In operation, when an electrical current flows through the write coil 322, a resulting magnetic field causes a magnetic flux to flow through the return pole 316, back gap 318, shaping layer 320 and write pole 314. This causes a magnetic write field to be emitted from the tip of the write pole 314 toward a magnetic medium 332. The write pole 314 has a cross section at the ABS that is much smaller than the cross section of the return pole 316 at the ABS. Therefore, the magnetic field emitting from the write pole 314 is sufficiently dense and strong that it can write a data bit to a magnetically hard top layer 330 of the magnetic medium 332. The magnetic flux then flows through a magnetically softer under-layer 334, and returns back to the return pole 316, where it is sufficiently spread out and weak that it does not erase the data bit recorded by the write pole 314. A magnetic pedestal 336 may be provided at the air bearing surface ABS and attached to the return pole 316 to prevent stray magnetic fields from the bottom leads of the write coil 322 from affecting the magnetic signal recorded to the medium 332.

In order to increase write field gradient, and therefore increase the speed with which the write head 306 can write data, a trailing, wrap-around magnetic shield 338 can be provided. The trailing, wrap-around magnetic shield 338 is separated from the write pole by a non-magnetic trailing gap layer 339.

The trailing shield 338 attracts the magnetic field from the write pole 314, which slightly cants the angle of the magnetic field emitting from the write pole 314. This canting of the write field increases the speed with which write field polarity can be switched by increasing the field gradient. A trailing magnetic return pole 340 can be provided and can be magnetically connected with the trailing shield 338. Therefore, the trailing return pole 340 can magnetically connect the trailing magnetic shield 338 with the back portion of the write head 306, such as with the back end of the shaping layer 320 and with the back gap layer 318. The magnetic trailing shield is also a second return pole so that in addition to magnetic flux being conducted through the medium 332 to the return pole 316, the magnetic flux also flows through the medium 332 to the trailing return pole 340.

The trailing magnetic shield 338 is separated from the write pole 314 by a non-magnetic trailing gap layer 342 that can also be used to separate the upper portion of the coil 322 from the write pole 314. The trailing gap layer 342 can be constructed of a material such as alumina, Ru or some other non-magnetic material and has a thickness that is chosen to provide a sufficient increase in write field gradient while also minimizing the loss of write field to the trailing shield 338.

Figure 4:
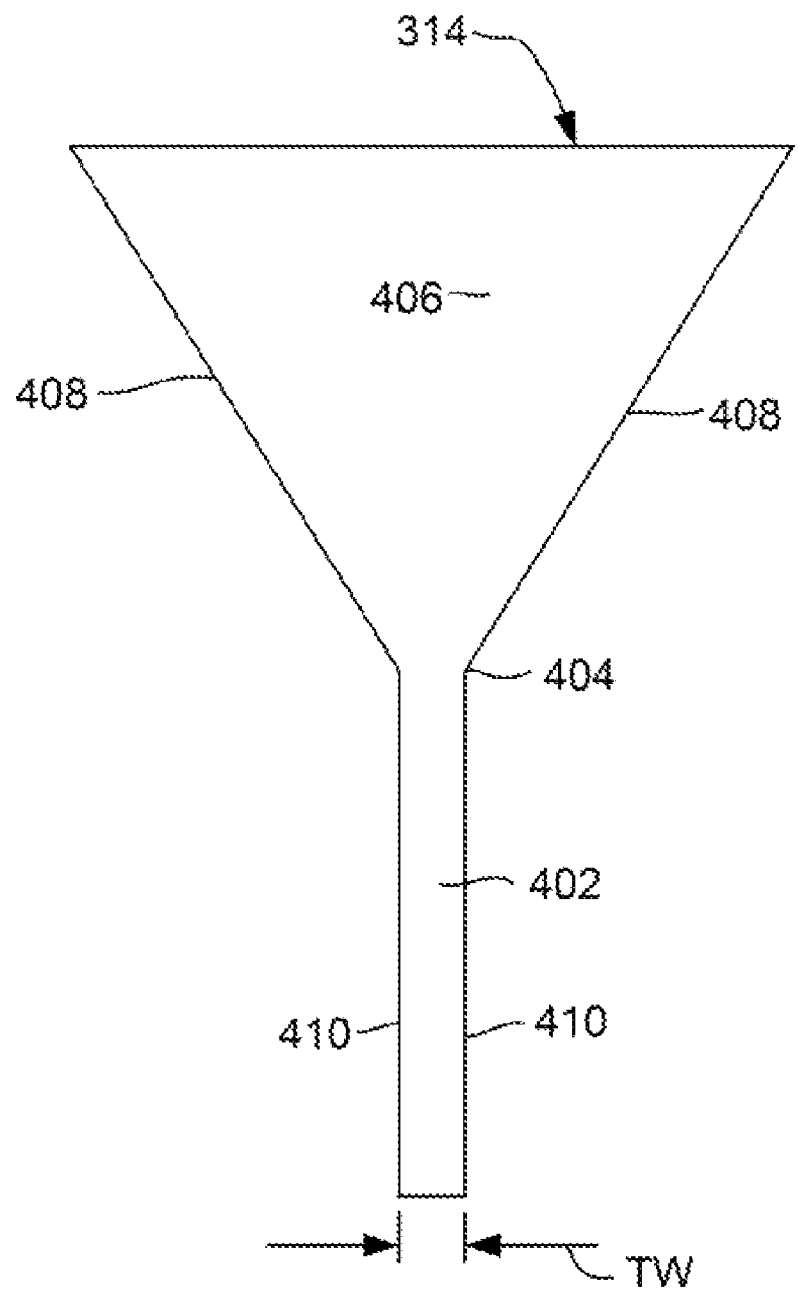
FIG. 4 is top down view of a write pole of the magnetic write head of FIG. 3.

FIG. 4 shows a top down view of the write pole 314. As can be seen, the write pole has a narrow pole tip portion 402 that extends to and terminates at the air bearing surface (ABS), and has a flared portion 406, the junction between the narrow pole tip portion 402 and the flared region 406 defining a flare point 404. The pole tip portion 402 has sides 410 that are substantially parallel with one another and perpendicular to the ABS. Therefore, the pole tip portion 402 has a substantially constant width from the ABS to the flare point 404. The flared portion 406, however has sides 408 that are not parallel with one another and which flare out to form an angle of, for example 30-60 degrees relative to the ABS. The flared portion 406, therefore does not have a constant width, but has a width that increases with increasing distance from the ABS.

The width of the pole tip portion 402 of the write pole 314 (e.g. the distance between the sides 410) is one of the key parameters that defines the track width of the magnetic write head. As mentioned above this track width must be reduced in order to increase the data density of the magnetic recording system. The manufacture of a write pole 314 involves certain photolithographic patterning and ion milling operations or reactive ion etch processes. In general, a layer of write pole material (such as a laminate of high magnetic moment magnetic material and thin non-magnetic layers) is deposited full film. Then, a mask is formed over the write pole material, the mask generally having the shape of the desired write pole. Then, a material removal process such as ion milling is performed to remove portions of the write pole material that are not protected by the mask to define the write pole.

Figure 5:
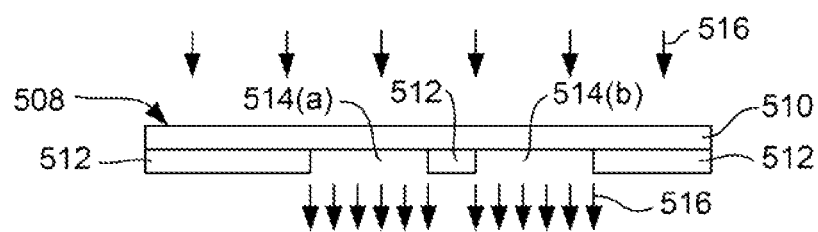
FIG. 5-8 are schematic views of a photolithographic process for defining a write pole.
Figure 5:
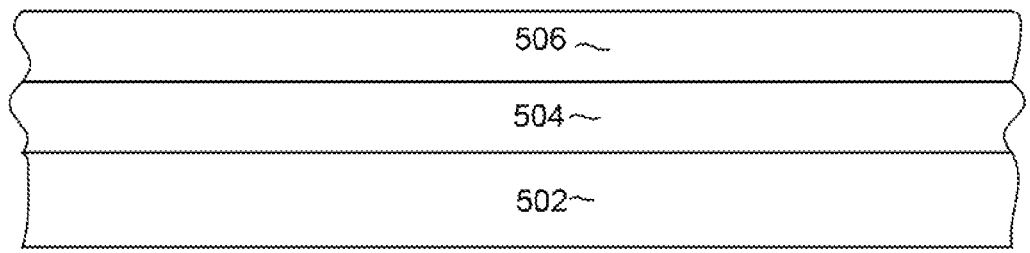
Figure 6:
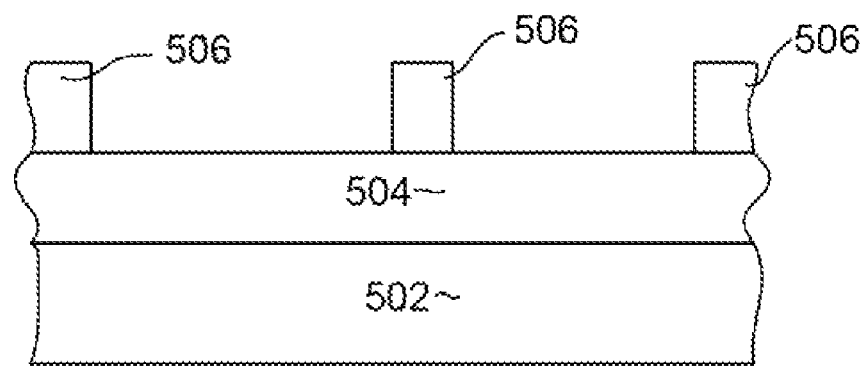
Figure 7:
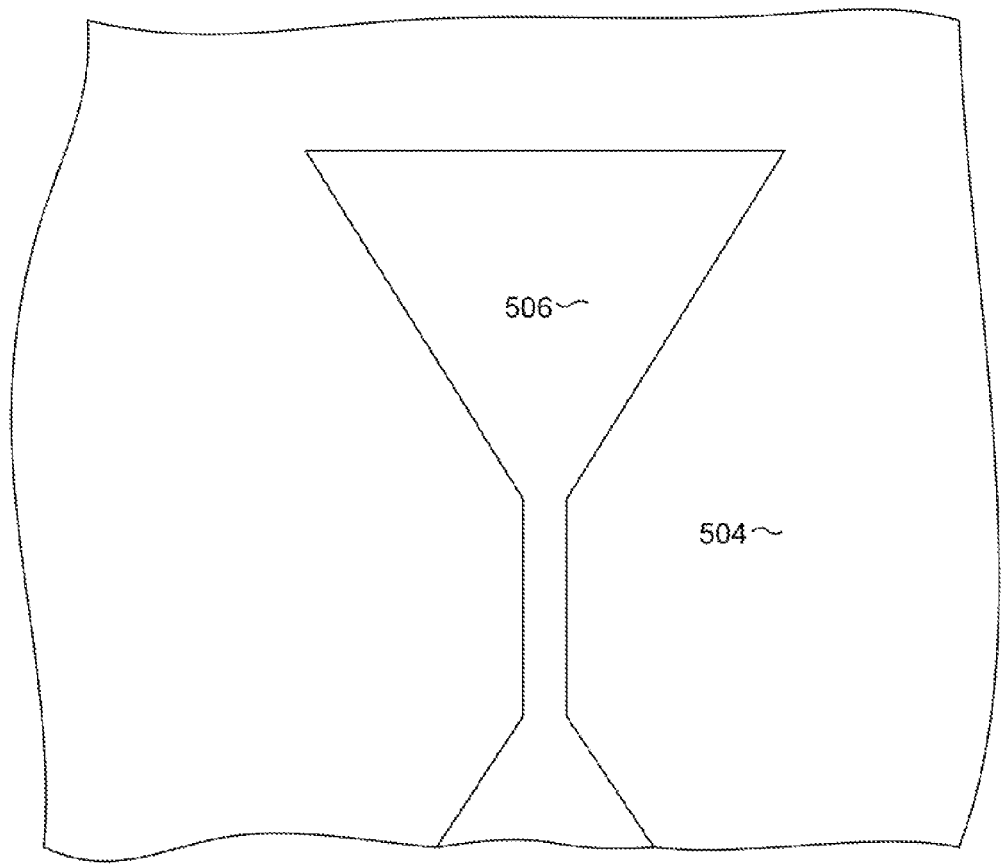
Figure 8:
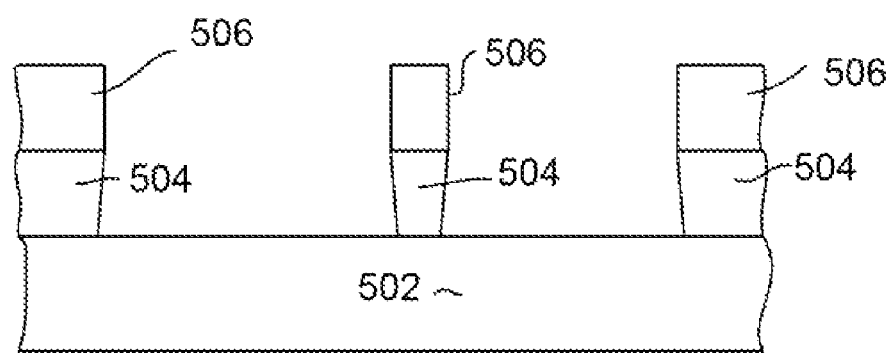

The resolution limits of photolithographic processes currently used to form the mask have reached a point where the width of the track width of the write pole can no longer be reduced with conventional binary mask. An example of this can be seen with reference to FIG. 5. In FIG. 5, a substrate 502 is covered with write pole laminate material 504. A photoresist layer 506 is deposited over the magnetic write pole layer 504. A mask structure 508 is then used to pattern the photoresist layer 506. The mask structure 508 can include a transparent substrate such as glass 510 and an opaque mask material (such as Cr) 512 that is formed with openings 514 that allow light to pass through, the light being represented by arrows 516. In this way, the mask 508 can be used to pattern the photoresist layer 506 by exposing selected portions of the photoresist 506 to light. If a negative photoresist is used, the openings 514 can be configured to define a pattern where photoresist 506 is to be removed. Then, after patterning, the exposed portions of the photoresist are removed, leaving a photoresist mask as shown in FIGS. 6 and 7. FIG. 7 shows a top down view of the structure shown in FIG. 6, as viewed from line 7-7 of FIG. 6. An ion milling can then be performed to remove portions of the magnetic material 504 as shown in FIG. 8. The remaining resist 506 can then be lifted off.

Figure 9:
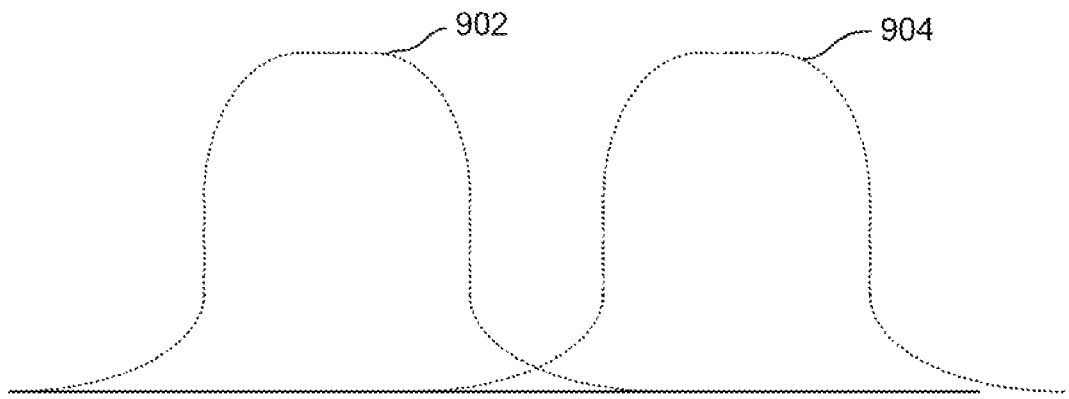
FIG. 9 is a graphical representation of light intensity contributions from separate portions of a mask from the prior art process of FIGS. 5-8.

The above process can form a write pole, however it has certain inherent resolution limitations that limit the amount by which the track width of the write pole can be reduced. FIG. 9 shows a graphical representation of the amplitude of the light emitted from the openings 514 in the mask 508 across the wafer. The line 902 represents the amplitude of the light coming from the left opening 514(a), whereas the left opening represents the light emitting from right opening 514(b) (FIG. 5). As can be seen, the transition between regions where the light shines and where the light does not shine is not a precise, sharp transition, but includes somewhat of a tapering off of the exposure.

Figure 10:
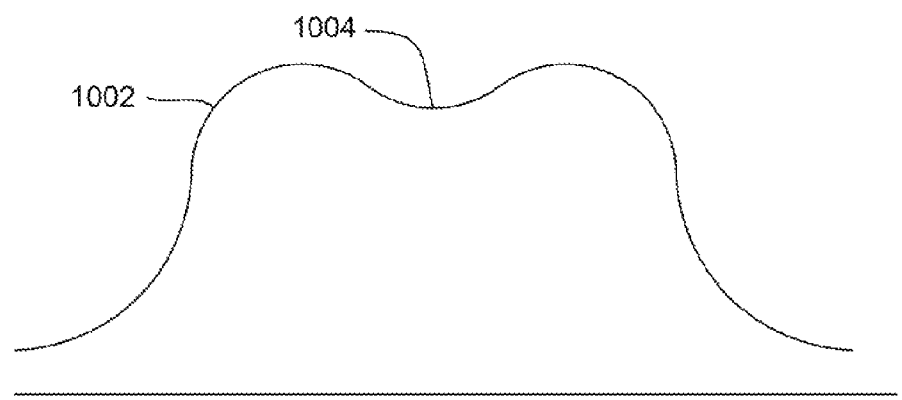
FIG. 10 is a graphical representation of a total light intensity on the surface of a wafer when using the prior art process of FIGS. 5-8.

FIG. 10 shows the amplitude of the combined effects of the exposure of light from the left opening 514(a) and the right opening 514(b) (FIG. 5). This can be viewed as the superposition of lines 902 and 904 of FIG. 9, and is the light amplitude that the resist layer 506 sees. As can be seen in FIG. 10, the line 1002 represents the total combined light intensity across a portion of the wafer, and the region in the center 1004 where there should be no light and which defines the track width of the wafer actually has a large amount of light. This is unacceptable, of course and is more pronounced at very small track widths.

Figure 11:
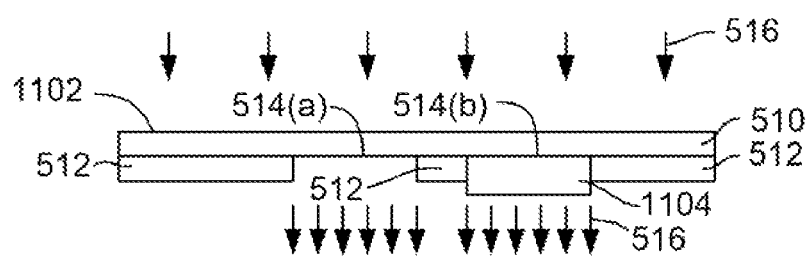
FIG. 11 is a schematic representation of a phase shifting photolithographic process.
Figure 11:
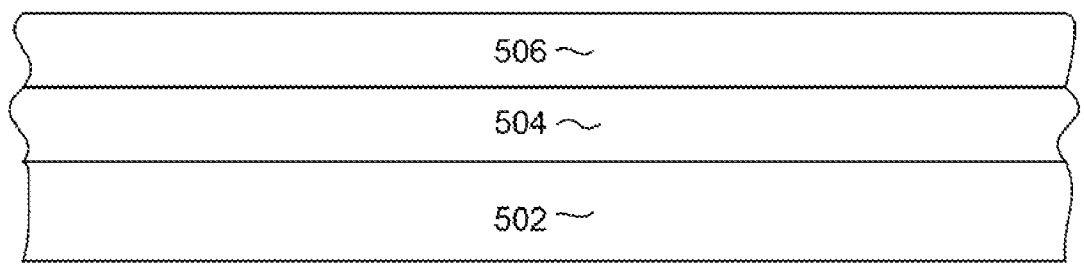
Figure 12:
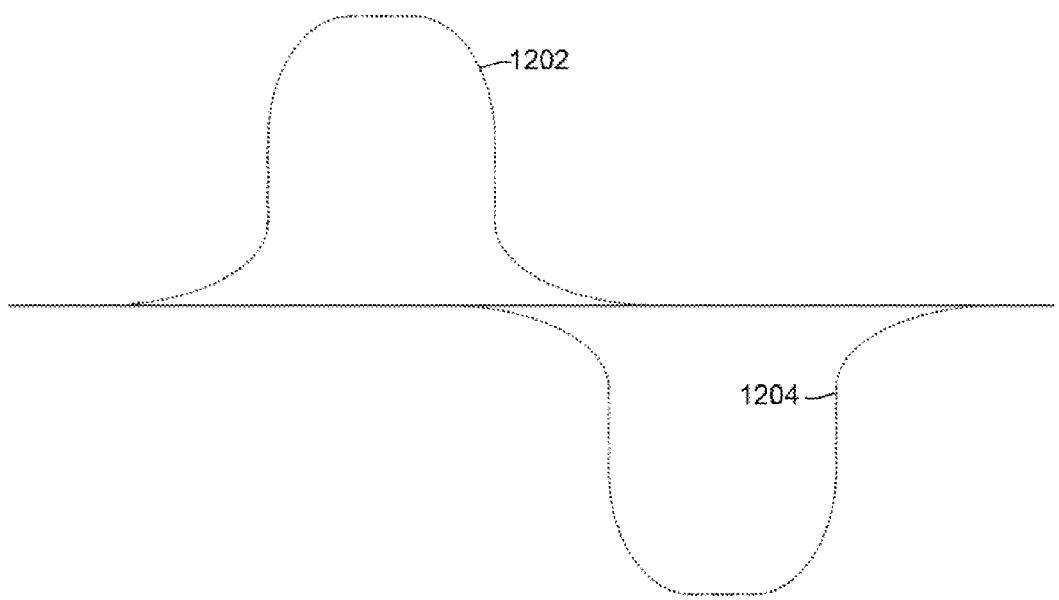
FIG. 12 is a graphical representation of individual light intensity contributions of separate portions of a lens when using the phase shifting photolithographic process of FIG. 11.
Figure 13:
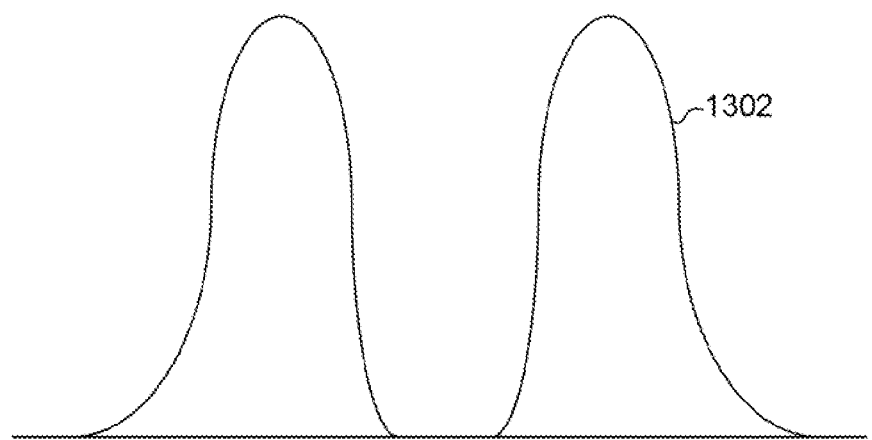
FIG. 13 is a graphical representation of the combined, total light intensity of light at the surface of a wafer when using the phase shifting photolithographic process of FIG. 11.

FIG. 11 illustrates a phase shift mask 1102 which can be used to mitigate the effects of this superposition of light. FIG. 11 shows a mask structure 1102 that is similar to the mask structure 508 of FIG. 5, except that one of the openings (e.g. 514(b)) has a phase shifting layer 1104 connected therewith. This phase shifting layer 1104 is a transparent, refractory material that shifts the period of the light passing therethrough, so that the light coming from opening 514(b) is 180 degrees out of phase with the light emitting from the other opening 514(a). The amplitude of this light is represented by the graph on page 12, wherein line 1202 represents the amplitude of the light from the left opening 514(a) and line 1204 represents the light emitting from the right opening 514(b). As can be seen, the light from these different openings 514(a) and 514(b) has the same amplitude magnitude (absolute value), but the amplitudes are opposite to one another. The absolute value of the superposition of this light is represented by line 1302 in FIG. 13, where it can be seen that the opposite phase of the light allows for a much shaper transition and a zero amplitude in the region of the write pole as desired.

However phase shift technology such as described above does not work well for the formation of structures such as write pole. For example, as described above the write pole has a flared portion. The patterning of one side of the write pole with light that is 180 degrees out of phase with the light patterning the other side of the write pole can cause the flared portion of the write pole to be asymmetrical. In addition, this phase shifting can actually shift the center line of the constant cross section, narrow pole tip portion of the write pole at defocus. A challenge then arises as to how this phase shift technology can be implemented to define a magnetic writer that not only has a constant width pole tip portion, but also has a flared potion as described above with reference to FIG. 4. The present invention solves this problem, allowing phase shift technology to be implemented in the construction of such as write pole having a flared region as well as a constant width pole tip region.

Figure 14:
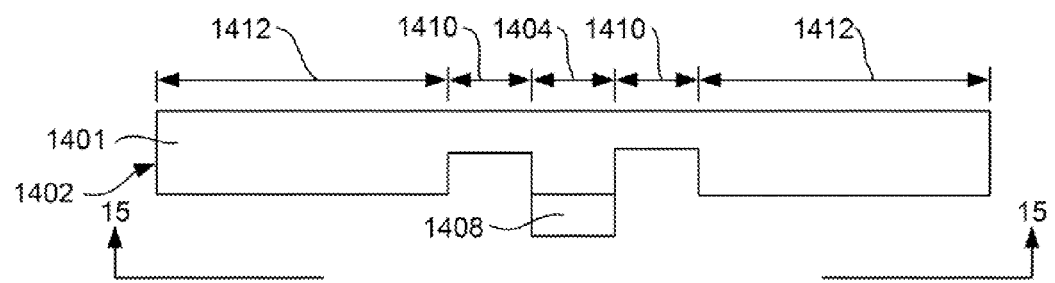
FIG. 14 is a schematic cross sectional view of a photolithographic mask according to an embodiment of the invention.
Figure 15:
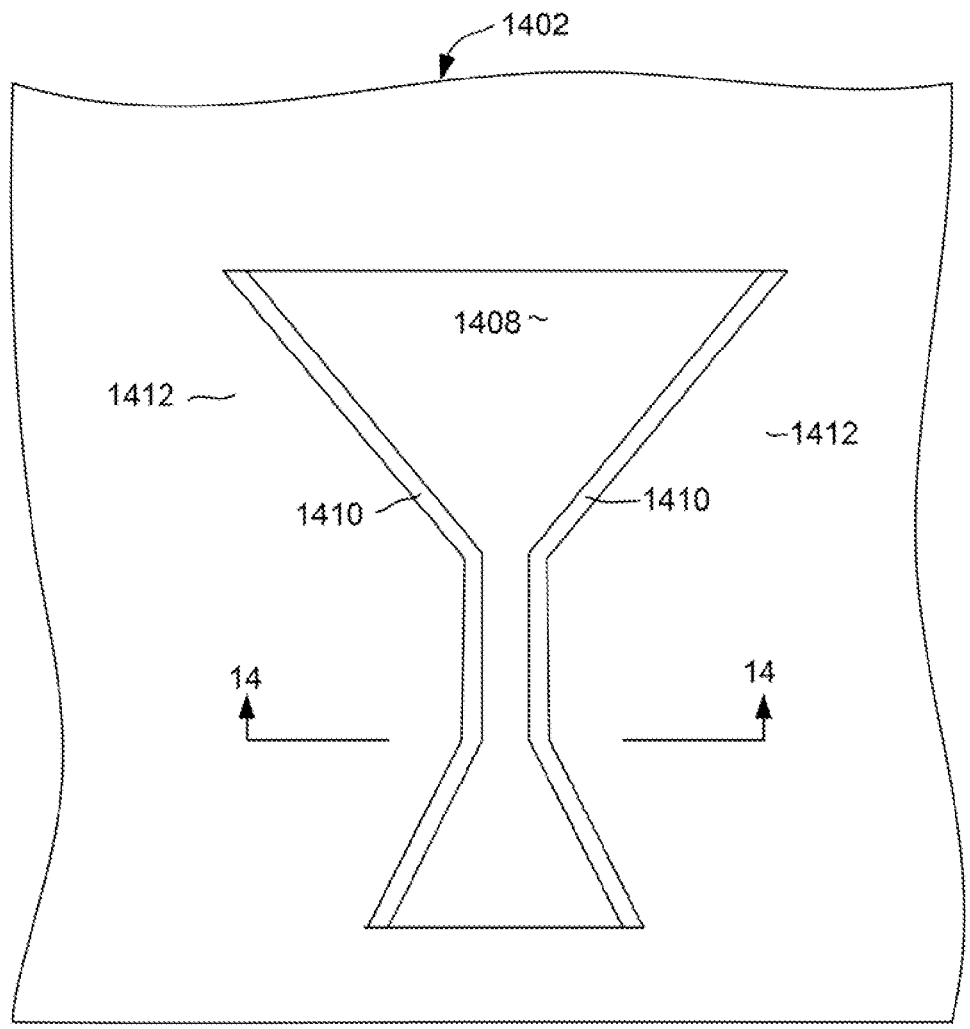
FIG. 15 is a view of the mask of FIG. 14 as viewed from line 15-15 of FIG. 14.

FIGS. 14 and 15 illustrate a novel phase shifting mask according to one possible embodiment of the invention. FIG. 14 shows a cross sectional view of a portion of the mask 1402 (as viewed from line 14-14 of FIG. 15) and FIG. 15 shows a top down view of the mask 1402 (as viewed from line 15-15 of FIG. 14). As shown in FIG. 14, the mask includes a transparent medium 1401 constructed of a material such as glass. 1402 has an opaque portion 1404, shown at its center. This opaque portion has a layer of opaque material 1408 such as Cr, which as shown in FIG. 15 is configured in the shape of a desired write pole pattern.

The mask 1402 also has first and second transparent phase shifted portions 1410 at either side of the opaque portion 1404, and has non-phase shifted portions 1412 beyond the phase shifted portions 1410. As can be seen, in FIGS. 14 and 15, the phase shifting portion 1410 and non-phase shifting portion 1412 are symmetrical about the write pole defining opaque portion 1408 defined by the opaque layer 1408. This advantageously avoids any asymmetry in the flared portion of the write pole and also advantageously avoids any shifting of the pole tip portion. The phase shifting portions 1410 each have a relatively narrow width (measured from the opaque portion 1404 to the adjacent non-phase shifting portion 1412) of 20-80 nm or about 40 nm.

With reference to FIG. 14, the phase shifting of light passing through the transparent portions 1410 and 1412 is accomplished by changing the thickness of the transparent medium (e.g. glass 1401). The refraction of light through the transparent medium 1401 shifts the phase of light passing through the medium 1401 as a function of the thickness of the medium through which it passes. Therefore, by making the portions 1410 much thinner than the portions 1412 the phase of light passing through the thinner portions 1410 can be made to be 180 degrees out of phase with the thicker portions 1412. A method for constructing a mask having these thinner portions 1410 and thicker portions 1412 will be described in greater detail herein below.

Figure 16:
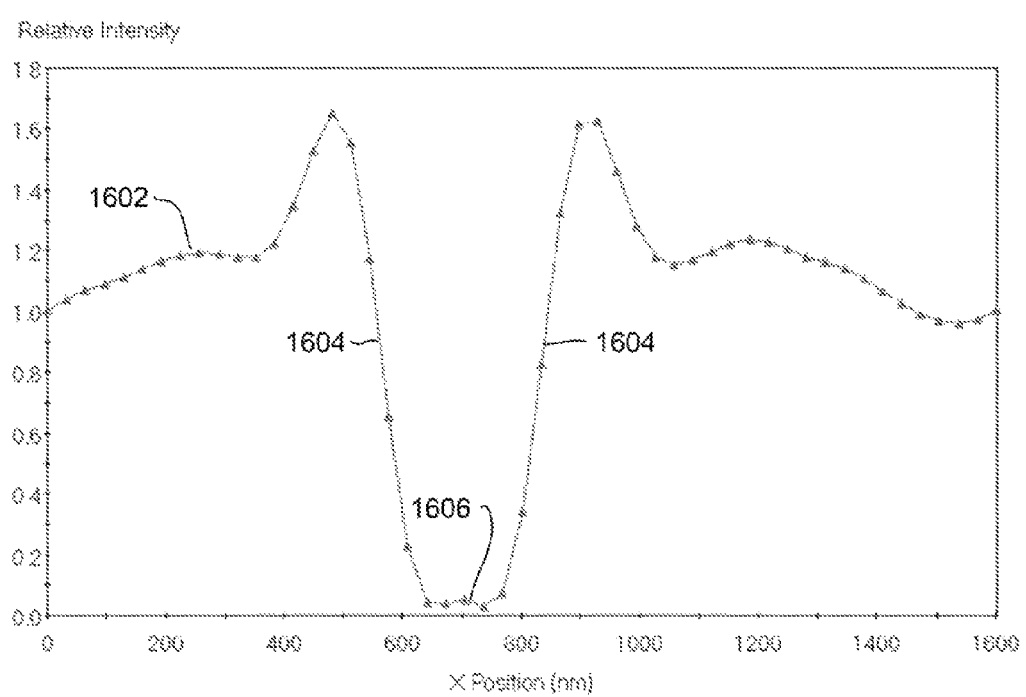
FIG. 16 is a graphical representation of light intensity at the surface of a wafer using the mask of FIGS. 15 and 16.

FIG. 16 shows graphically the intensity profile light at the wafer across the track width region where a write pole is to be formed. The line 1602 illustrates the intensity of the light striking the wafer. As can be seen, the phase shifted portions 1410 (FIGS. 14 and 15) allow the light intensity profile 1602 to have a steep profile 1604 at the location edges of the write pole track-width as is desired. The intensity profile 1602 also includes a flat bottom 1606 at near 0 intensity.

Figure 17:
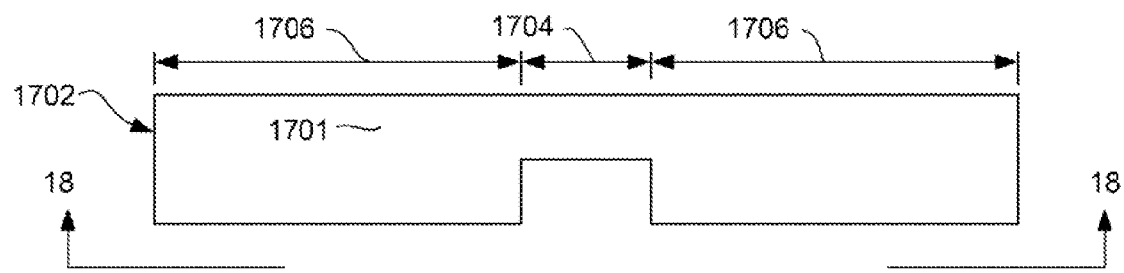
FIG. 17 is a side cross sectional view of a photolithographic mask according to another embodiment of the invention.
Figure 18:
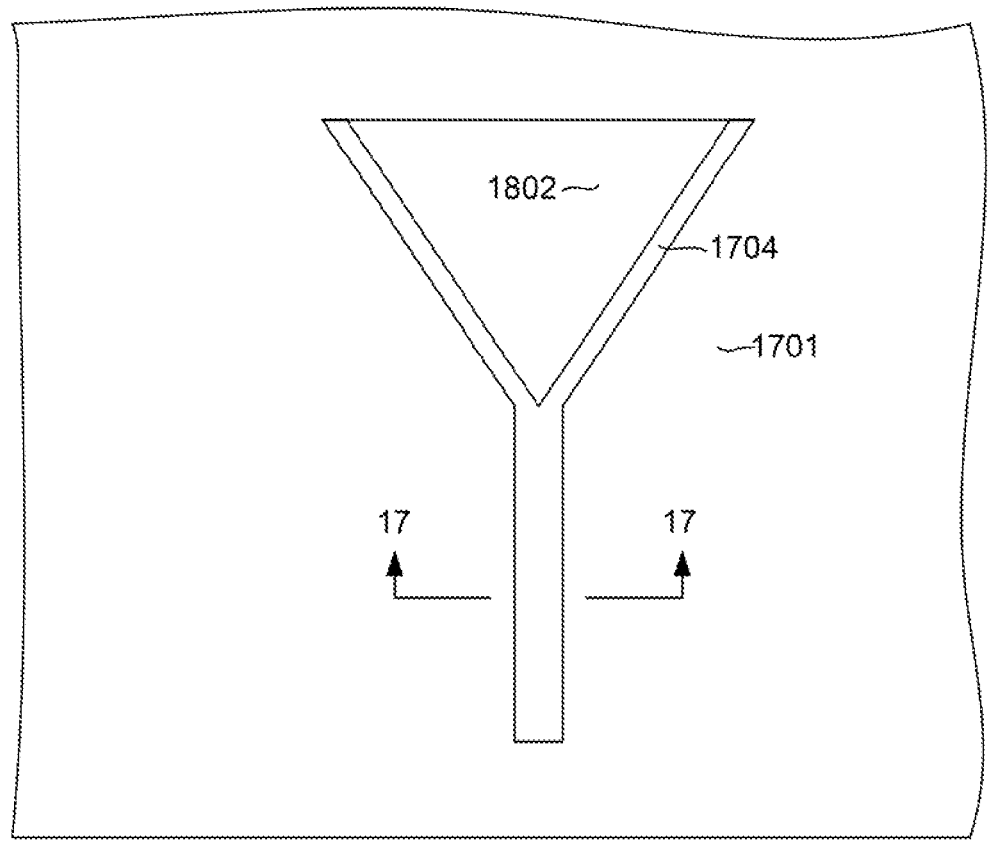
FIG. 18 is a view of the mask of FIG. 17 as seen from line 18-18 of FIG. 17.

FIGS. 17 and 18 illustrate a mask structure 1702 according to another embodiment of the invention. In this embodiment a phase shift alone defines the pole tip portion of the write pole so that no opaque material is needed to define this structure. The only portion that is defined by an opaque material portion is the larger, flared region of the write head. FIG. 18 shows a top down view of a view of a mask structure 1702 and FIG. 17 shows a cross sectional view of the mask structure 1702 as viewed from line 17-17 in the pole tip region. As can be seen in FIG. 18, the mask 1702 includes a transparent medium 1701 having a centrally disposed phase shift portion 1704 having a thickness that is smaller than the outer non-phase shifted regions 1706. The phase shifting region has a width of 20-80 nm or about 60 nm. As with the above described embodiment, this reduced thickness in the region 1704 shifts the phase of light passing there-through relative to the light passing through the thicker regions 1706. The transition between the different phases causes a steep reduction in light intensity on the wafer in the region corresponding to the centrally disposed phase shift portion 1704.

Figure 19:
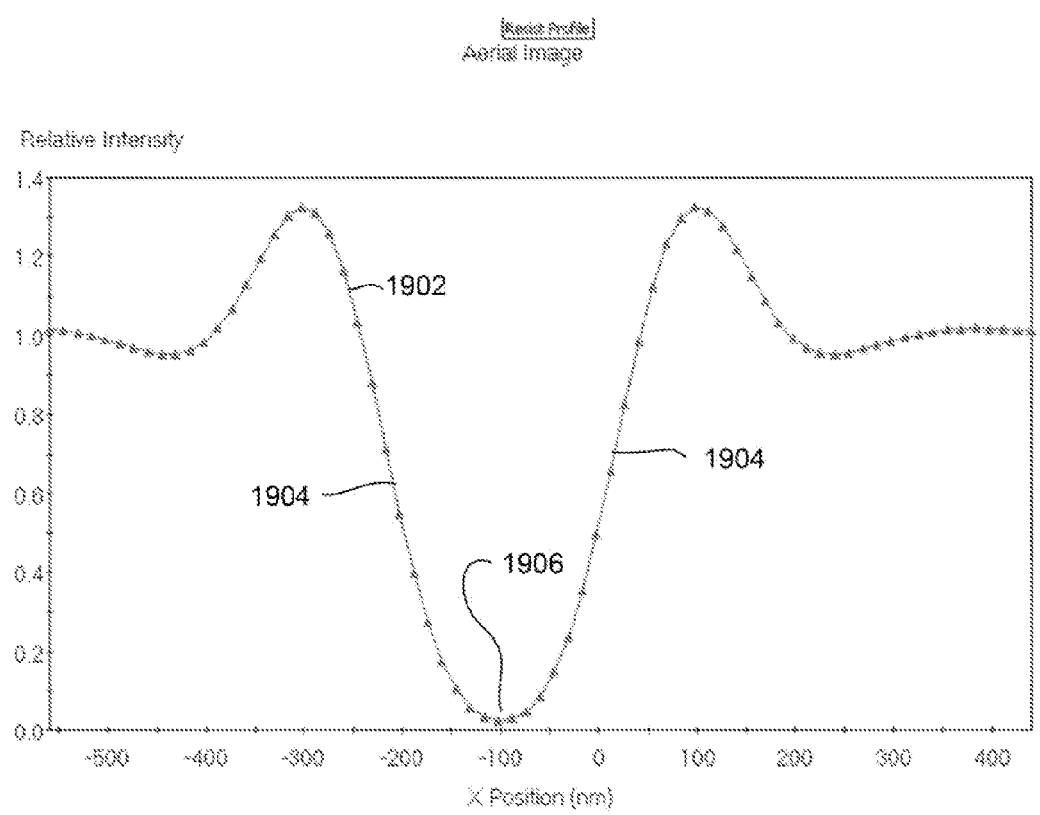
FIG. 19 is a graphical representation of light intensity across a wafer using the mask of FIGS. 17 and 18.

This abrupt reduction in light intensity at the wafer can be seen in FIG. 19, wherein line 1902 represents the light intensity across the wafer. As can be seen, the phase shifting results in very steep side walls 1904 and a bottom 1906 that is rounded rather than flat. With reference again to FIG. 18 it can be seen that an opaque layer 1802 such as Cr is need in the larger flared portion of the write pole defining mask 1702 in order to prevent light from being applied to the portion of the wafer that corresponds to the flared region of the mask 1702. This is because the use of 100% transmission phase shifting alone to produce a sharp reduction in light intensity can only work for narrow structures such as to define the pole tip region of the write pole.

Figure 20:
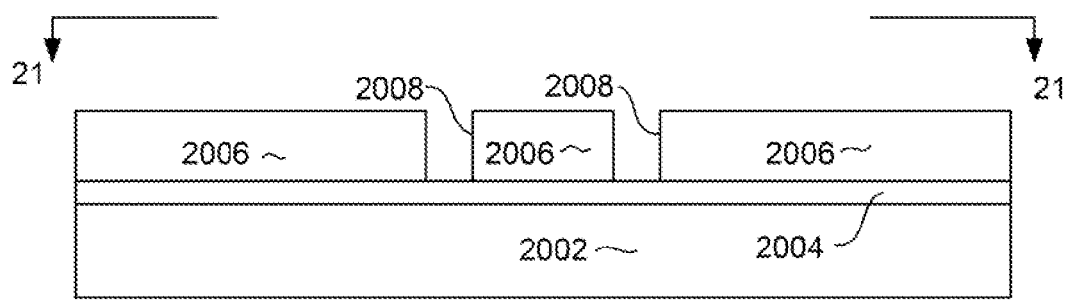
FIGS. 20-26 are schematic views illustrating a method of manufacturing a mask such as the mask described above with reference to FIGS. 14 and 15.
Figure 21:
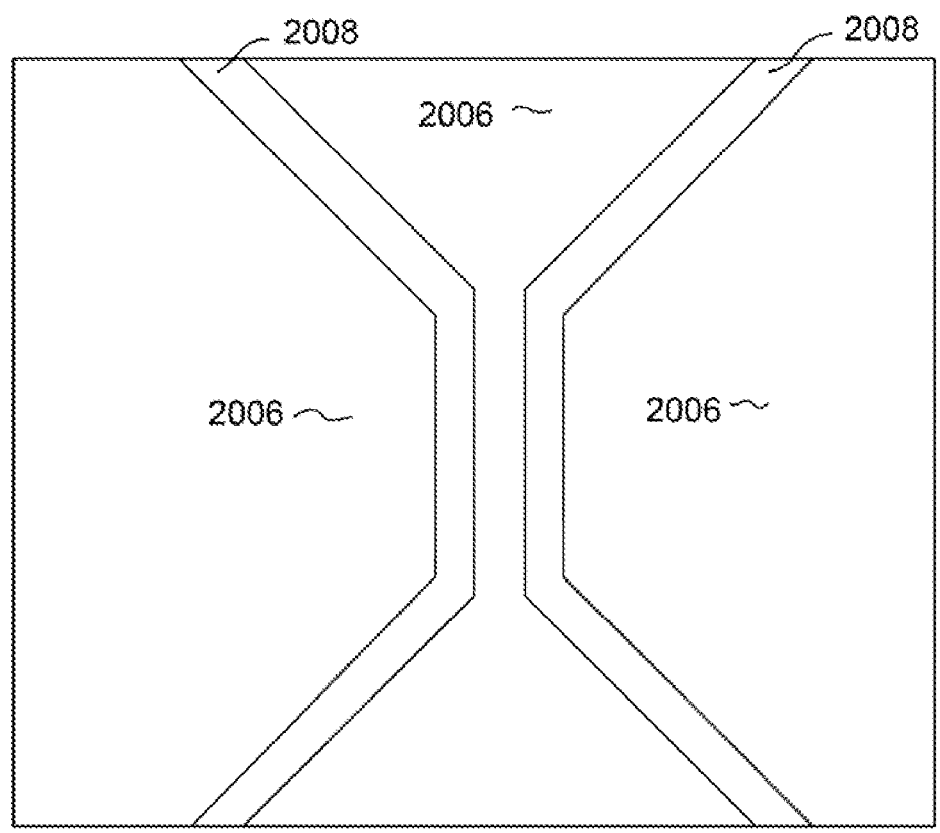

With reference now to FIGS. 20-26 a method is described for constructing a mask such as that described above with reference to FIGS. 14 and 15. With particular reference to FIG. 20, a transparent substrate such as glass 2002 is provided. A layer of opaque material such as Cr 2004 is deposited over the glass 2002. A first photoresist mask 2006 is then formed over the opaque layer 2004. The photoresist mask is patterned to have trenches 2008 that are configured to define the location of a phase shifted region on the glass 2002 as will be apparent below. The pattern of the trenches 2008 can be seen more clearly with reference to FIG. 21.

Figure 22:
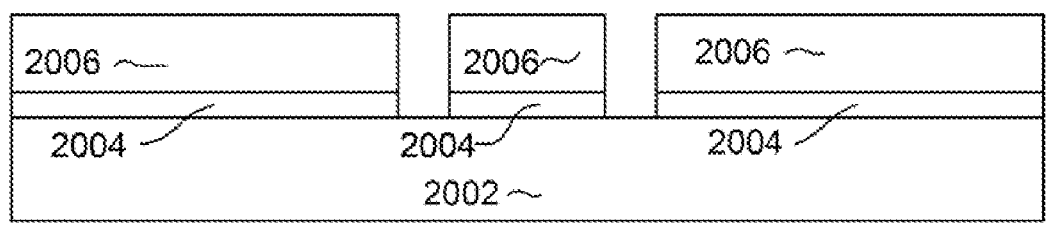
Figure 23:
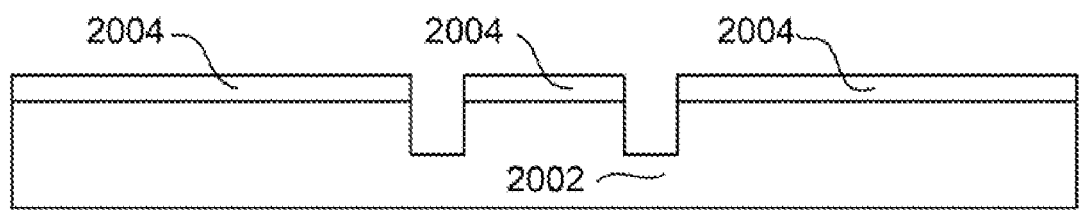

Then, with reference to FIG. 22 a reactive ion etching is performed to remove portions of the opaque layer 2004 that are not protected by the photoresist mask 2006. If the opaque layer is Cr, then the reactive ion etching can be performed using a $Cl_2/O_2/He$ plasma chemistry. Then, a chemical removal process such as a quartz etch is performed to remove portions of the transparent layer 2002, using the remaining opaque layer 2004 as a hard mask. This leaves a structure such as that shown in FIG. 23. The etch is performed to such an extent that the remaining thickness of the glass 2002 in the etched area will cause light passing there-through to be 180 degrees out of phase with light passing through the un-etched areas.

Figure 24:
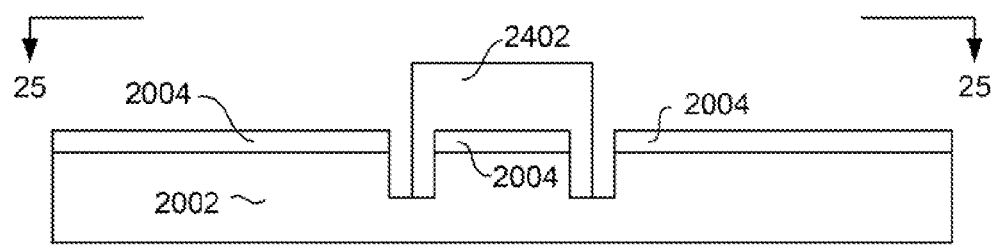
Figure 25:
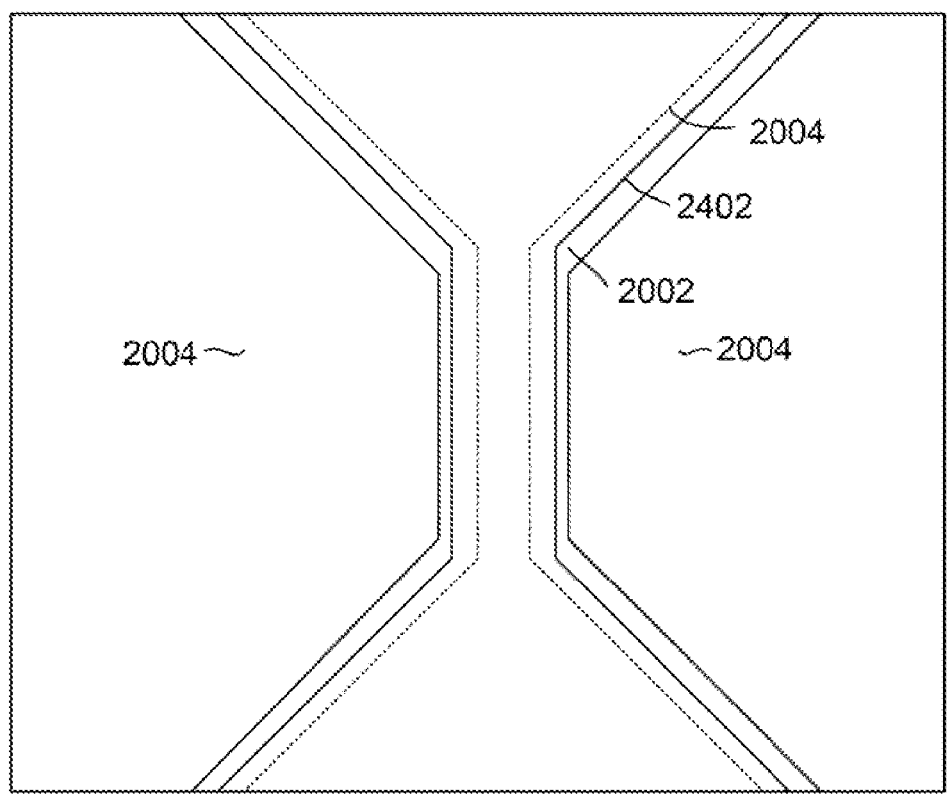
Figure 26:
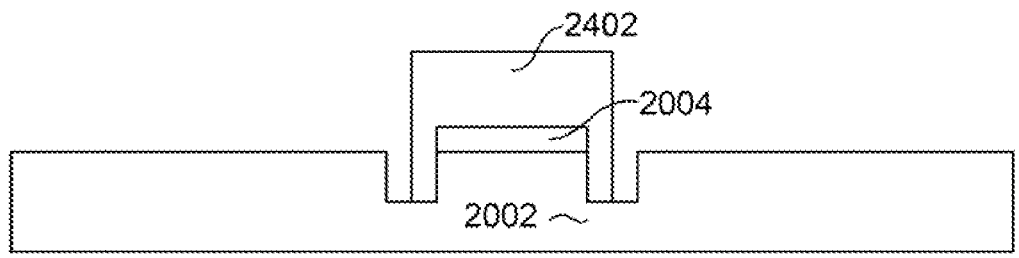

Then, with reference to FIGS. 24 and 25 a second photoresist mask 2402 is formed over a portion of the remaining opaque layer. As can be seen, the second photoresist layer covers a portion the opaque layer that is to remain in the finished mask, leaving other portions of the opaque layer uncovered. In FIG. 25, the edges of the inner portion of opaque layer 2004 that are beneath the photoresist layer are shown in dotted line to indicate that they are hidden beneath the second photoresist mask. A reactive ion etching can then be performed to remove unwanted portions of the opaque layer, leaving a structure as shown in cross section in FIG. 26. The remaining second photoresist mask layer 2402 can then be lifted off, leaving a mask structure such as that described above with reference to FIGS. 14 and 15.

Figure 27:
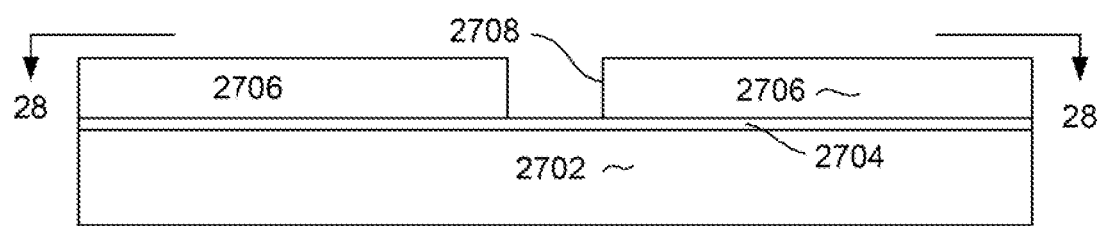
FIGS. 27-31 are schematic views illustrating a method of manufacturing a mask such as the mask described above with reference to FIGS. 17 and 18.
Figure 28:
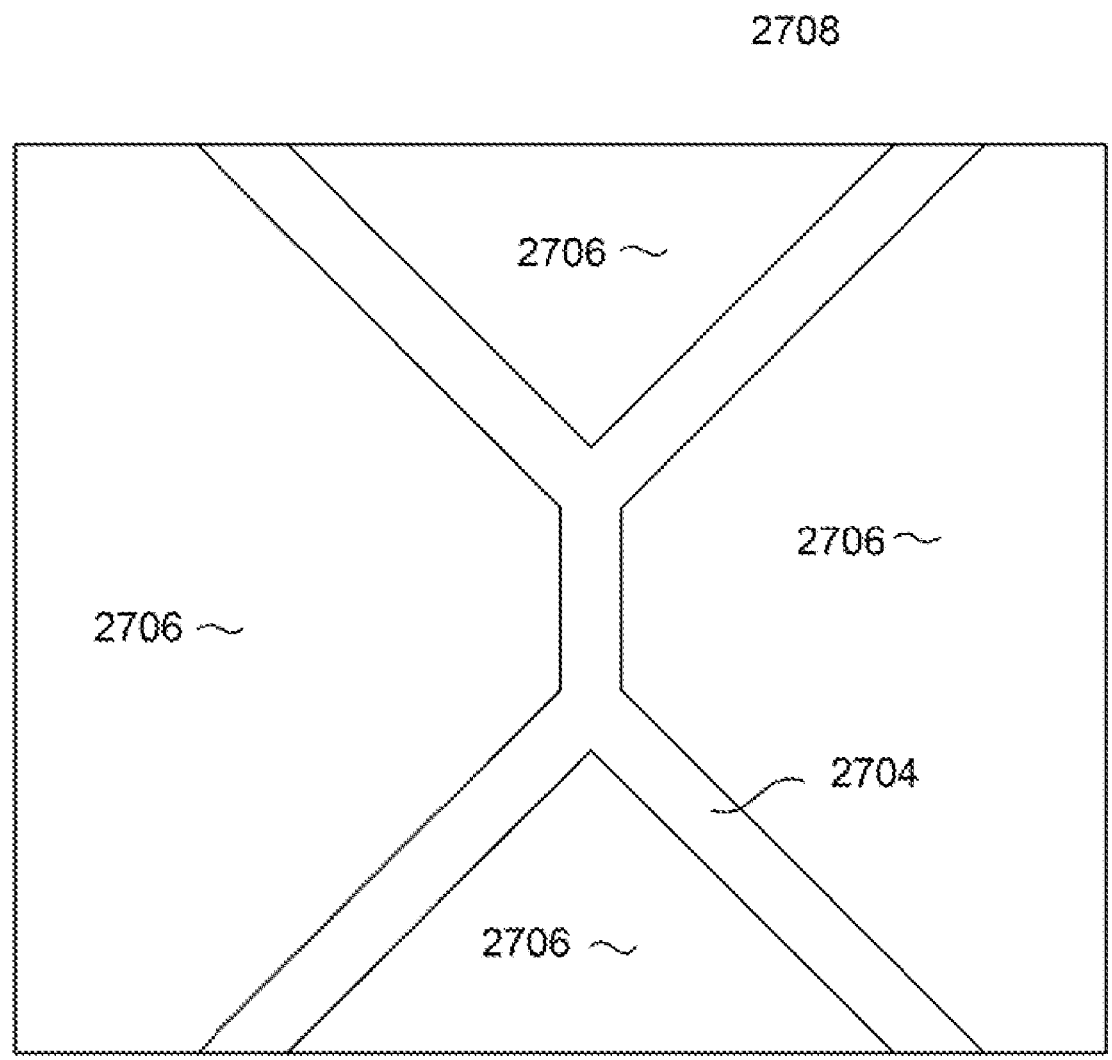

With reference now to FIGS. 27-31, a method is described for constructing a mask such as that described with reference to FIGS. 17 and 18. With particular reference to FIG. 27, a transparent substrate 2702 such as glass or quartz is provided, and a layer of opaque material such as Cr 2704 is deposited over the transparent substrate 2702. A photoresist mask 2706 is formed over the opaque layer 2704, and is patterned with a trench 2708 that can be seen more clearly with reference to FIG. 28.

Figure 29:
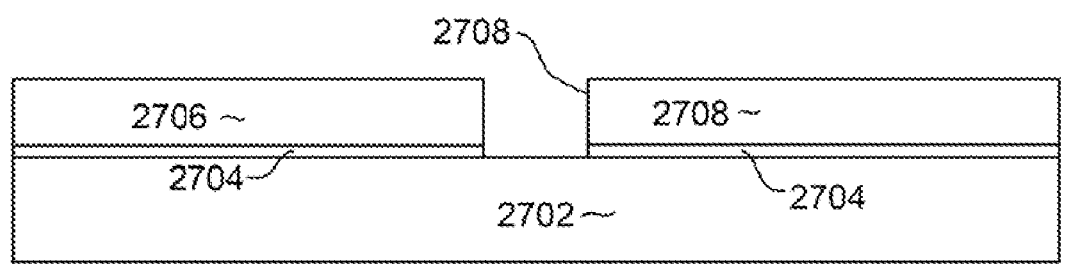
Figure 30:
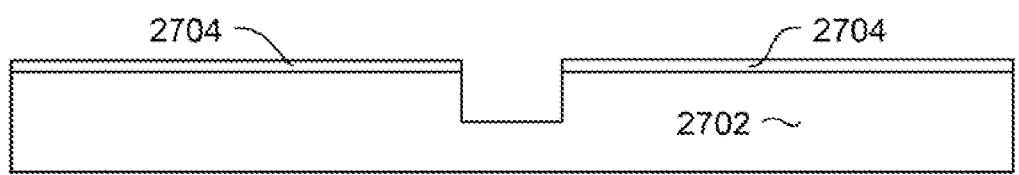
Figure 31:
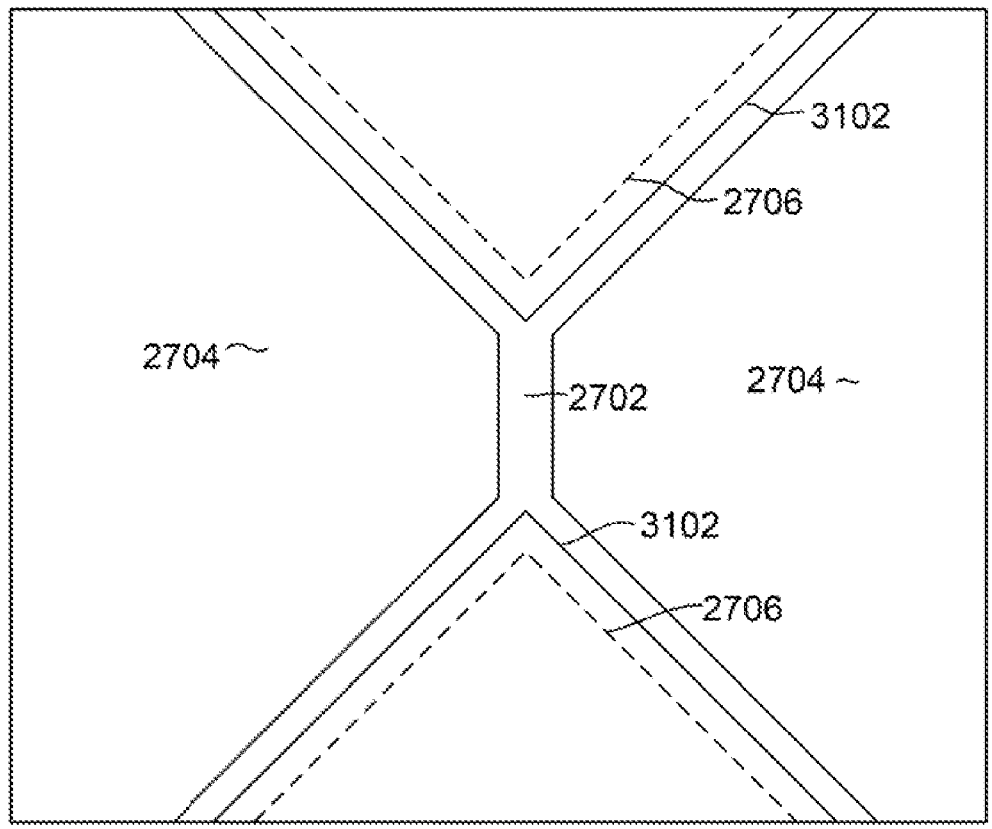

Then, a material removal process such as reactive ion etching is performed to remove portions of the opaque layer 2704 that are not protected by the mask 2706, leaving a structure such as that shown in FIG. 29. If the opaque layer 2704 is Cr, then the reactive ion etching can be performed in a $Cl_2/O_2/He$ plasma chemistry. Another material removal process such as a quartz etching can then be performed to remove a portion of the transparent substrate 2702 in the trench to form a recess in the transparent substrate layer as shown in FIG. 30. As with the above described embodiment, the transparent layer 2702 is recessed by an amount such that light passing there-through will be 180 degrees out of phase with light passing through unrecessed portions of the transparent layer 2702.

Then, a second photoresist mask 3102 is formed to cover portions of the opaque layer that are to remain in the finished mask structure. This photoresist mask 3102 can be seen in FIG. 31 to cover top and bottom portions of the opaque layer 2704, while leaving side portions of the opaque layer 2704 unprotected. The edges of the opaque layer 2704 that are hidden beneath the photoresist 3102 are shown in dashed line to indicate that they are hidden beneath the photoresist 3102. Another reactive ion etching can be performed, for example in a $Cl_2/O_2/He$ plasma chemistry, to remove the unprotected portions of the opaque layer 2704. The photoresist 3102 can then be lifted off, leaving a structure such as that shown in FIGS. 17 and 18.

It should be pointed out that, while the above description describes the use of the novel phase shift mask technologies in the construction of a magnetic pole of a magnetic write head, this is by way of example only. The above described phase shifting technology can be used in the formation of many other types of photolithographically defined 2-D structures, such but not limited to magnetic read sensors/writer and microcircuits.

While various embodiments have been described, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A mask for photolithographic patterning, comprising:
   a first mask region having an opaque portion having first and second sides;
   first and second transparent phase shifting regions formed at the first and second sides of the opaque portion;
   a transparent non-phase shifted region extending beyond the first and second phase shifting portions; and
   a second mask region having a narrow phase shifted portion and a non-phase shifted region and having no opaque portion wherein and configured to define a narrow feature by only the phase difference between a phase shift between the phase shifted region and the non-phase shifted region.

2. The mask as in claim 1 wherein the first and second transparent phase shifting portions each have a thickness that light passing through the first and second phase shifting portions is 180 degrees out of phase with light passing through the non-phase shifting portions.

3. The mask as in claim 1 wherein the first and second transparent phase shifting portions have a thickness that is less than a thickness of the transparent non-phase shifting portion.

4. The mask as in claim 1 further comprising a glass medium, wherein the opaque region comprises a layer of opaque material formed over a portion of a surface of the glass medium, and wherein the first and second phase shifting portions further comprise a recess formed in the glass medium such that the glass medium has a thickness in the first and second transparent phase shifting regions that is less than a thickness of the glass medium in the non-phase shifting region.

5. The mask as in claim 1 further comprising a quartz medium, wherein the opaque region comprises a layer of opaque material formed over a portion of a surface of the quartz medium, and wherein the first and second phase shifting portions further comprise a recess formed in the quartz medium such that the glass medium has a thickness in the first and second transparent phase shifting regions that is less than a thickness of the glass medium in the non-phase shifting region.

6. The mask as in claim 1 wherein the opaque portion is in the shape of a magnetic write pole of a magnetic write head.

7. The mask as in claim 1 wherein the phase shifting regions each have a width of $0.05\lambda$-$0.60\lambda$, where $\lambda$ is the exposure wavelength.

8. The mask as in claim 1 wherein the phase shifting regions each have a width of about 0.20, where $\lambda$ is the exposure wavelength.

9. A mask for photolithographically patterning a feature on a wafer, the mask comprising:
   a transparent medium;
   a phase shifted region formed in the transparent medium; and
   a non-phase shifted region immediately adjacent to the phase shifted region such that a transition between the phase shifted region and non-phase shifted region allows patterning of a feature on the wafer without the need for an opaque feature on the mask.

10. The mask as in claim 9 wherein the phase shifted region comprises an etched recess formed in the transparent substrate.

11. The mask as in claim 9 wherein the phase shifted region has first and second sides defining a width of $0.2\lambda$-$0.7\lambda$, where $\lambda$ is the exposure wavelength, there-between and has a non-phase shifted region at either side.

12. The mask as in claim 9 wherein the phase shifted region has first and second sides defining a width of about $0.40\lambda$, where $\lambda$ is the exposure wavelength, there-between and has a non-phase shifted region at either side.

13. The mask as in claim 9 wherein the transition between the phase shifted region and the non-phase shifted region defines a narrow structure in a first portion of the mask, and wherein a second portion of the mask includes an opaque region that defines a larger structure.

14. The mask as in claim 9 wherein the transparent substrate comprises glass.

15. The mask as in claim 9 wherein the transparent substrate comprises quartz.

16. The method as in claim 9 wherein the phase shifting region is configured to define a pole tip region of a magnetic write pole.

17. A method for patterning a feature on a wafer, comprising:
   providing a wafer;
   depositing a layer of photoresist on the wafer;
   photolithographically patterning the photoresist using a mask, the mask comprising:
   an opaque portion having first and second sides;
   first and second transparent phase shifting regions formed at the first and second sides of the opaque portion;

a transparent non-phase shifted region extending beyond the first and second phase shifting portions; and a second mask region having a narrow phase shifted portion and a non-phase shifted region and having no opaque portion wherein and configured to define a narrow feature by only the phase difference between a phase shift between the phase shifted region and the non-phase shifted region.

18. The method as in claim 17 further comprising, before depositing the photoresist, depositing a magnetic write pole material; and wherein the photolithographic patterning produces a photoresist mask formed over the magnetic write pole material; and the method further comprising after photolithographically patterning the photoresist performing an ion milling to remove portions of the magnetic write pole material that are not protected by the photoresist mask.

19. A method for patterning a feature on a wafer, comprising:

providing a wafer;

depositing a layer of photoresist on the wafer;

photolithographically patterning the photoresist using a mask, the mask comprising:

a transparent medium;

a phase shifted region formed in the transparent medium; and a non-phase shifted region immediately adjacent to the phase shifted region such that a transition between the phase shifted region and non-phase shifted region allows patterning of a feature on the wafer without the need for an opaque feature on the mask.

20. The method as in claim 19 further comprising, before depositing the photoresist, depositing a magnetic write pole material; and wherein the photolithographic patterning produces a photoresist mask formed over the magnetic write pole material; and the method further comprising after photolithographically patterning the photoresist, performing an ion milling to remove portions of the magnetic write pole material that are not protected by the photoresist mask.

\* \* \* \* \*